(12) United States Patent
McBride et al.

(10) Patent No.: US 6,487,703 B1
(45) Date of Patent: Nov. 26, 2002

(54) METHOD AND SYSTEM FOR SCREENING A VLSI DESIGN FOR INDUCTIVE COUPLING NOISE

(75) Inventors: John G. McBride, Ft. Collins, CO (US); Osamn S. Nakagawa, Redwood City, CA (US); Shen Lin, Foster City, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 8 days.

(21) Appl. No.: 09/909,297

(22) Filed: Jul. 19, 2001

(51) Int. Cl.[7] .............................................. G06F 17/50
(52) U.S. Cl. .............................................. 716/4; 716/2
(58) Field of Search ......................... 716/4, 2

(56) References Cited

U.S. PATENT DOCUMENTS 6,378,109 B1 * 4/2002 Young et al. .................. 716/4

* cited by examiner

*Primary Examiner*—M. Tran

(57) ABSTRACT

A method is disclosed for estimating inductive coupling noise of a signal on a transmission line in a circuit design stored in a computer memory. The method determines the capacitive coupling noise on the signal, adds inductive coupling noise, and compares the total to a specified maximum amount of noise. The inductive coupling is a percentage of a supply voltage, which percentage varies depending upon the transition rate of the signal, the resistance of the line, and the gate capacitance of a load on the line. The inductive coupling varies based on the circuit design and may be stored in a table having inductive coupling values for multiple design conditions. The table is created using a field solver to determine line characteristics and a circuit simulator to simulate inductive coupling noise. For each set of initial conditions, a worst-case inductive coupling value is recorded in the table.

20 Claims, 6 Drawing Sheets

300

| Transition Rate | Line Resistance (R) | Gate Capacitance of Load ($C_{gate}$) | Action |
|---|---|---|---|
| > 100 ps | Not Applicable | Not Applicable | Pass |
| 100-80 ps | < 100 ohms | < 20 fF | Add 4% Vdd |
| 100-80 ps | < 700 ohms | < 10 fF | Add 4% Vdd |
| 80-60 ps | < 500 ohms | < 20 fF | Add 4% Vdd |
| 80-60 ps | < 1500 ohms | < 10 fF | Add 5% Vdd |
| 60-40 ps | < 700 ohms | < 20 fF | Add 4% Vdd |
| 60-40 ps | < 2000 ohms | < 10 fF | Add 7% Vdd |

METHOD AND SYSTEM FOR SCREENING A VLSI DESIGN FOR INDUCTIVE COUPLING NOISE

FIELD OF INVENTION

The present invention relates generally to computer software for the design of semiconductor chips. More particularly, it relates to a software method for analyzing inductive coupling noise in a circuit design.

BACKGROUND

In the field of circuit design, and in particular very large scale integration (VLSI) design, it is desirable to store a design in a computer memory so that the design can be analyzed and modified to ensure that it meets desired specifications. The VLSI design stored in memory may include data regarding each element in the design and about connections between elements. Parts of the design may include transmission lines or other connecting portions that connect the devices in the design.

These lines have certain circuit characteristics that may also be included in the design model. For example, the transmission lines may have a certain resistance and self-inductance. The transmission lines may also have coupling capacitance between adjacent lines, and between the line and ground, depending upon the circuit configuration. The properties of the lines may cause signal integrity problems when adjacent lines transition from low to high, or vice versa. Depending upon the line properties, an "aggressor" line physically close to a "victim" line may create noise on the victim line. Signal integrity is affected by the strength of the signals and the time required for signals to transition from low to high, or vice versa, referred to as the transition rate. In order to properly analyze the circuit, it is desirable to determine the capacitive coupling, the resistance, the transition rate, and the strength of the victim driver to ensure that the lines meet specification. Methods are known to exist for extracting each of these elements relatively quickly and easily.

Transmission lines also have a self-inductance, L, and physically close lines in a circuit design also have a mutual inductance, M. The mutual and self-inductance also affects signal performance and should be analyzed as part of the circuit analysis. Existing methods do not provide a quick and easy means for determining inductance. However, as designs continue to scale downward in size, inductance becomes a more significant factor in circuit performance. Also, as designs begin using copper and other materials with a lower resistivity, line resistance decreases, again making the inductance a more significant factor in the circuit analysis. What is needed is a method and system for easily and quickly estimating the inductance effects of lines in a VLSI design.

SUMMARY OF INVENTION

A method is disclosed for estimating the inductive coupling noise of a signal on a transmission line in a circuit design stored in a computer memory. The design may have a specification for a maximum amount of noise on a signal. The method determines the noise on the signal caused by capacitive coupling between lines, also referred to as the line capacitance. Noise caused by the inductive coupling is then added to the capacitive coupling noise to compute a total noise value, which is compared to the specification. The inductive coupling is a percentage of the supply voltage, which percentage varies depending upon the transition rate of the signal, the resistance of the line, and the gate capacitance of a load on the line.

The inductive coupling varies based on the circuit design and may be stored in a table having inductive coupling values for multiple design conditions. The table is created for a design by specifying initial conditions such as the width of the lines, the spacing between lines, the maximum distance to a ground line, and the transition rate of a signal on the line. A field solver may process these initial conditions to determine line characteristics for each line, such as resistance, capacitance, and inductance. A circuit simulation application then uses the characteristics to calculate the total noise on the lines as a percentage of supply voltage. The circuit simulation application also determines the RC noise on the lines caused by the resistance and capacitance, excluding the inductance. From these values, the method concludes that the difference in noise values is attributable to inductive coupling. For each line in the portion of the design considered, the method calculates the inductive coupling and records the maximum inductive coupling noise for any line within a specified portion, for example between regularly-spaced ground lines. For each set of initial conditions, a worst-case inductive coupling value is recorded in the table for use by the method.

In one embodiment, the method determines whether the inductive coupling causes noise in excess of four percent of the supply voltage. If the noise is less than four percent, it is ignored; otherwise, the inductive coupling noise is determined, added to the capacitive coupling noise, and compared to the total amount of noise. In one embodiment, the method assumes that ground signals are routed throughout the design at regular intervals to minimize the effect of inductive coupling.

SUMMARY OF DRAWINGS

FIG. 5 shows an example of a table created and used by the method.

DETAILED DESCRIPTION

Figure 1:
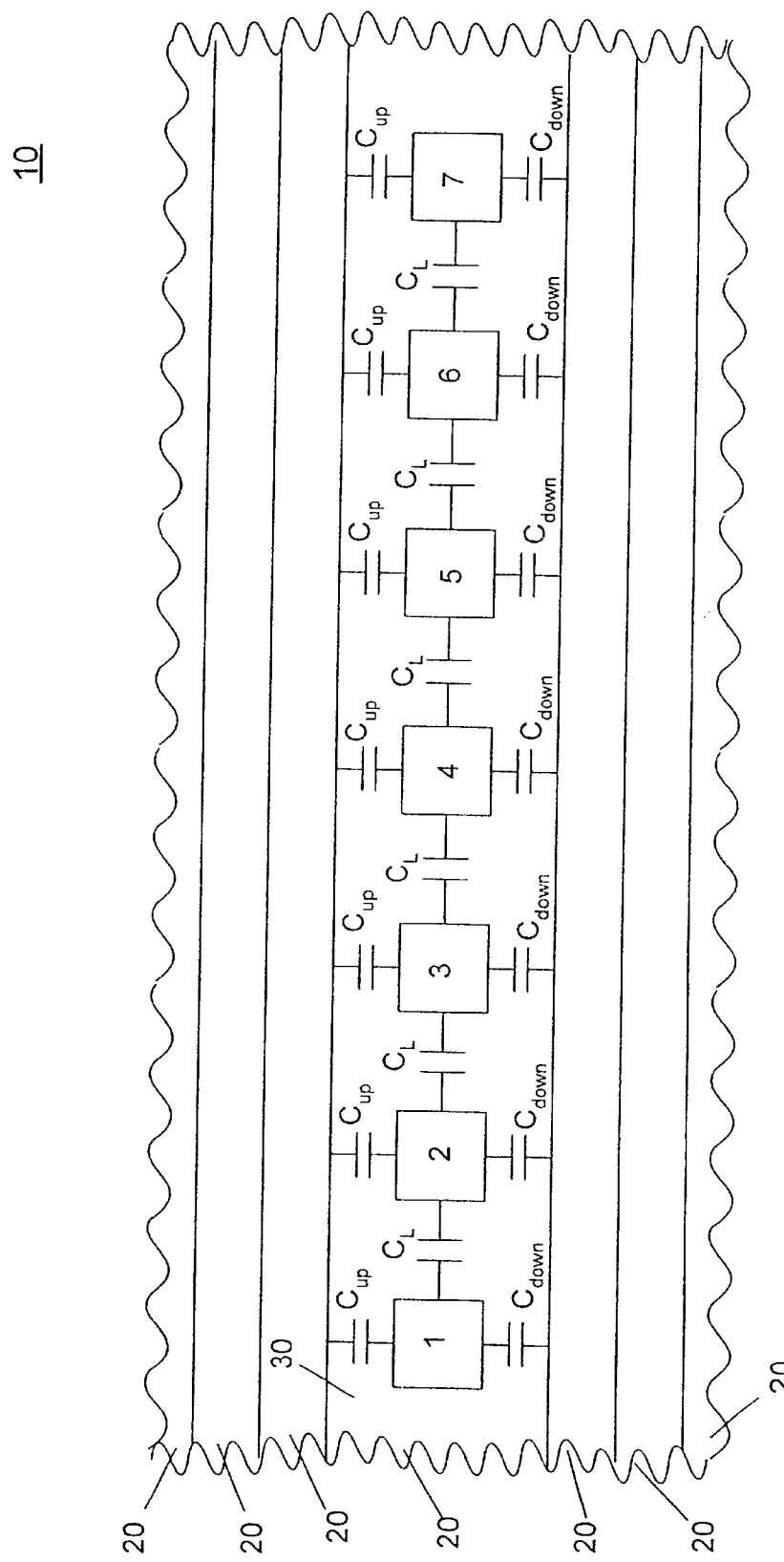
FIG. 1 shows a multi-layered integrated circuit.

FIG. 1 shows a cross-section of an integrated circuit (IC) chip 10, such as a very large scale integration (VLSI) chip 10, having multiple layers 20. The chip 10 may be a design. Each layer 20 of the chip 10 may comprise circuit elements and transmission lines. One layer 20 is shown with cross-sections of a plurality of transmission lines 1, 2, 3, 4, 5, 6, 7. Layers 20 having lines 1, 2, 3, 4, 5, 6, 7 may be referred to as metal layers 20. The transmission lines 1, 2, 3, 4, 5, 6, 7 are surrounded by a dielectric 30. The lines 1, 2, 3, 4, 5, 6, 7 are separated from each other by a distance specified in the design. The transmission lines 1, 2, 3, 4, 5, 6, 7 are shown to have capacitances between each other, referred to as the line capacitance, or $C_l$, and between ground lines in adjoining layers 20, above and below, referred to as $C_{UP}$ and $C_{down}$. The transmission lines 1, 2, 3, 4, 5, 6, 7 may connect different devices on the chip 10. Adjacent layers 20 may also have transmission lines, and in one embodiment the transmission lines on one layer 20 may be orthogonal to lines on adjacent layers 20.

In one implementation, the method assumes that a certain number of lines 1, 2, 3, 4, 5, 6, 7 are ground lines. In order to decrease the effect of inductive coupling, a VLSI design may space ground lines at regular intervals. This provides the method with a specified range of distances from each line 1, 2, 3, 4, 5, 6, 7 to ground. The part of the circuit comprising the lines between the ground lines may be analyzed as a portion of the design under test. The inductive coupling may be determined for the lines in one portion and the method may assume a worst-case scenario for the distance from the lines 1, 2, 3, 4, 5, 6, 7 to ground, based on the regular spacing of ground lines. In one embodiment, the method assumes that every sixth line is a ground line for purposes of calculating inductance. For example, in the embodiment shown in FIG. 1, lines 1 and 7 may be assumed to be ground lines, while the intermediate lines 2, 3, 4, 5, 6 may be carrying a signal. In other embodiments, the VLSI design may include ground lines spaced at different intervals.

Figure 2:
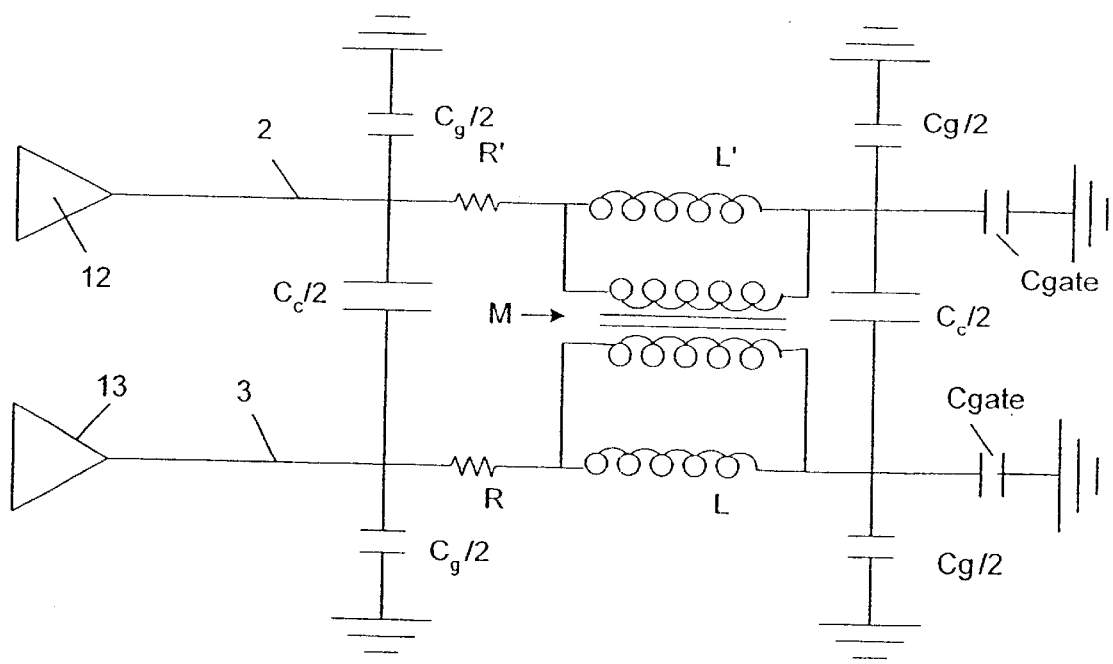
FIG. 2 shows a schematic diagram of two adjacent circuit lines.

FIG. 2 shows a schematic diagram of a model of two adjacent lines 2, 3. Each line 2, 3 carries a signal driven by a driver 12, 13 that operates at a specified supply voltage, Vdd. As shown, each line 2, 3 has a certain line resistance R, R' and a certain self inductance L, L', and in the model shown in FIG. 2, a total coupling capacitance C, between the lines 2, 3 is shown as two capacitors each having a value of $C_c/2$. The total ground coupling capacitance, $C_g$, is also modeled as two capacitors each having a value of $C_g/2$ between the lines 2, 3 and ground. The lines 2, 3 also have a mutual inductance M. In the example, one line 2 may be considered to be the aggressor, while the other line 3 may be considered to be the victim of the capacitive and inductive coupling between the lines 2, 3. As the aggressor line 2 transitions from high to low, or vice versa, a noise signal is created on the victim line 3 due to the coupling capacitance $C_c$ and the mutual inductance M. The design specification may have a maximum limit on capacitive and inductive coupling for each type of signal, so an analysis of the circuit design will be used to determine whether the noise created by the capacitive and inductive coupling exceeds the specification. This analysis allows a designer to reconfigure the system as necessary before manufacturing the chip 10. The lines 2, 3 connect devices, or loads, on the chip 10, such as the gates of field effect transistors (FETs). These devices have a gate capacitance, modeled in FIG. 2 as $C_{gate}$.

Figure 3:
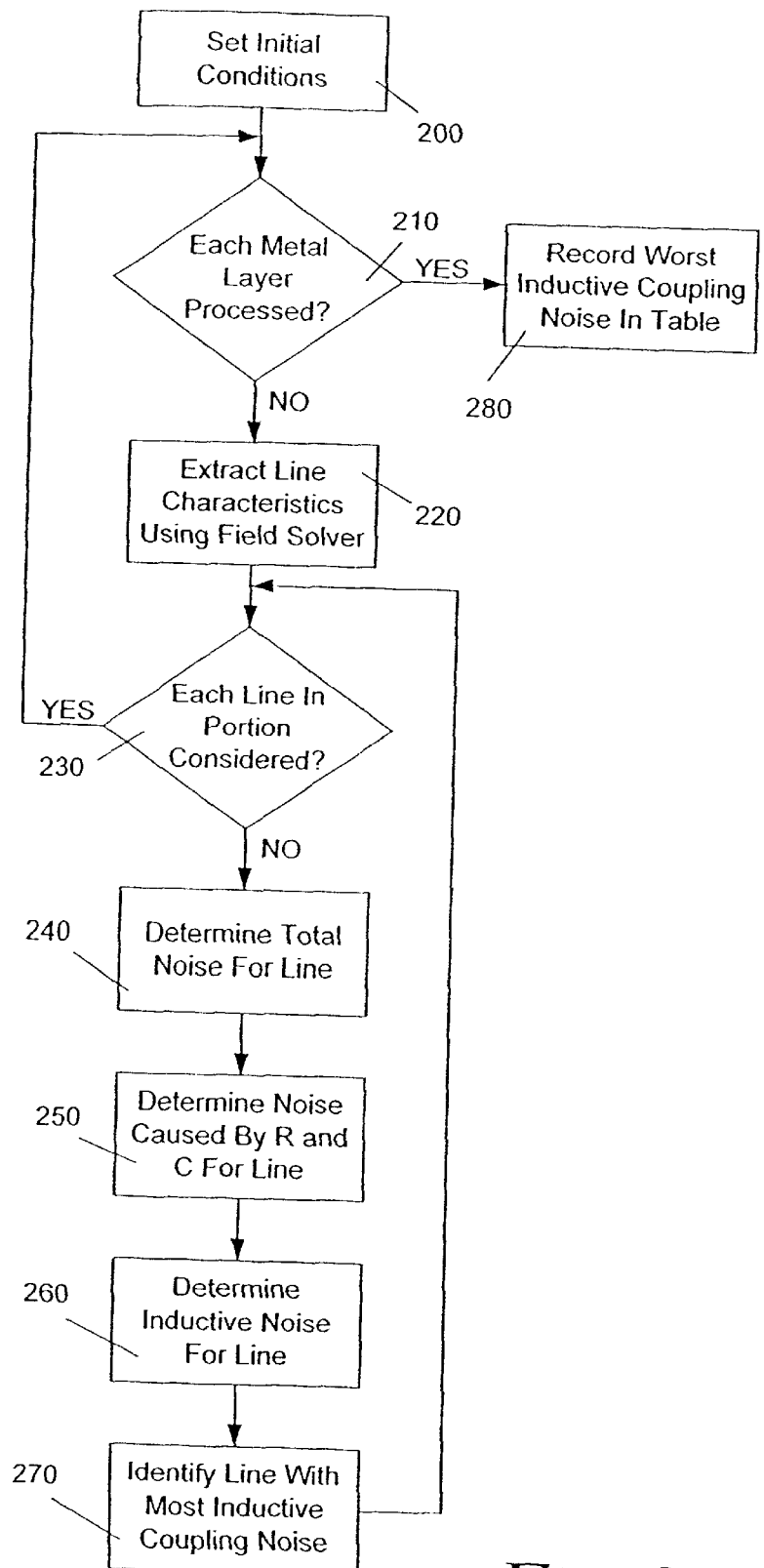
FIG. 3 shows a flow chart of the method for creating a table used to estimate inductive coupling noise in a circuit.

FIG. 3 shows a flow chart of the method used to create a table for estimating inductive coupling noise in a circuit design. For each entry in the table, initial variables or conditions are set 200. For example, a line width and spacing between lines may be set, based on the circuit design. Other initial conditions might include the transition time of the source, the gate capacitance of the gate furthest from the driver ($C_{gate}$), the length of the lines, and the frequency of the spacing of ground lines, which define a portion of the circuit to be considered. For example, it may be assumed that the ground lines are spaced at every sixth line throughout each metal layer 20, as shown in FIG. 1.

Using the initial conditions, the system then analyzes each line, e.g. 2, 3, in each metal layer 20 of the design. The system determines 210 whether each metal layer 20 has been processed. If not, then a field solver, such as the Rafael software program, is used to extract 220 the line characteristics, including the resistance, capacitance, and inductance. Each line, e.g. 2, 3, is then analyzed using a dynamic circuit simulation program, such as a SPICE application. The method determines 230 whether each line, e.g. 2, 3, 4, 5, 6, in the portion of the circuit between the ground lines has been processed. If each line, e.g. 2, 3, in the layer 20 has been processed, then the method proceeds 210 to analyze lines in the next metal layer 20.

If each line, e.g. 2, 3, in a layer 20 has not been processed, then the circuit simulation application analyzes the line characteristics and determines 240 the total noise on the line, e.g. 2, 3. The circuit simulation application also determines 250 the noise on the line, e.g. 2, 3, attributable to only the resistance and capacitance (the RC noise value), and subtracts this noise from the total noise to determine 260 the noise on the line caused by the inductance. The method attempts to identify 270 the worst-case scenario, which may be defined as the line, e.g. 2, 3, having the most inductive coupling noise. The method may store or track the line having the most inductive coupling noise in the layer 20. The method proceeds until each line, e.g. 2, 3, in each layer 20, or portion of the layer 20, has been considered for the specified initial conditions. When each line, e.g. 2, 3, in each layer 20, or portion of a layer 20, has been processed, the method determines 280 the amount of the highest inductive coupling noise in the circuit and records this amount in a table to be used to estimate inductive coupling noise. The method may then continue to identify inductive coupling noise for different initial conditions to create a table of values for inductive coupling noise, based on the different initial conditions.

Figure 4:
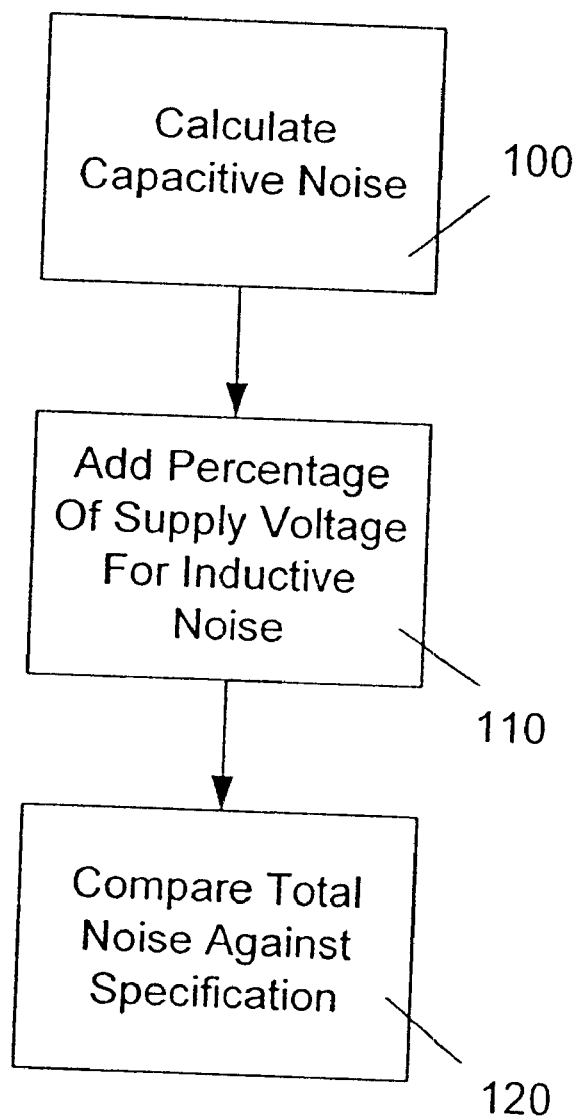
FIG. 4 shows a low chart of the method for using a table to estimate inductive coupling noise.

FIG. 4 shows the flow chart of the method for using a table to estimate the total noise caused by an aggressor line 2, including the noise caused by inductive coupling. The capacitive coupling noise is first calculated 100. A percentage of the supply voltage is then added 110 to the capacitive coupling noise to represent the inductive noise. The total noise is then compared 120 against a specification to determine whether the design requires further modification.

FIG. 5 shows a table 300 of values used to estimate the percentage of inductive noise to be added in the adding step 110. The table 300 is an example produced by the method illustrated in FIG. 3. The percentage of supply voltage to be added for inductive noise 110 is determined based on the rise/fall time of a signal on the aggressor line (also referred to herein as the transition rate), the resistance of the victim line (R), and the far-end gate capacitance of the load on the victim line ($C_{gate}$). The resistance (R) and gate capacitance ($C_{gate}$) are the values modeled in FIG. 2. The transition rate depends upon the driver 12, 13 and the design, and may be stated in the specification or may be extracted from the design using known methods. In one implementation, the method and system may assume that the aggressor and victim lines 2, 3 have the same resistance, self-inductance, and transition rates.

In the implementation shown in FIG. 5, the method ignores inductive coupling noise less than 4% of the driver voltage, Vdd. The table 300 used to calculate the percentages of inductive noise considers the transition rate—that is, the rise time or fall time of the aggressor signal. It also considers the line resistance R and the gate capacitance of the load $C_{gate}$. As shown in the example of FIG. 5, if the transition rate is between 100 and 80 picoseconds, the line resistance is less than 200 ohms, and the gate capacitance is less than 20 femptofarads, then the inductive coupling noise is estimated to be 4% of the victim's driver voltage. As another example, if the transition rate is between 60 and 40 picoseconds, the resistance is less than 2,000 ohms, and the gate capacitance is less that 10 femptofarads, then 7% of the driver voltage is used to represent the inductive coupling noise. Other specific examples can be extracted using the table of FIG. 4. The table may be used to estimate the inductive coupling on a particular line. This value may then be added 110 to the capacitive coupling noise to determine whether the total noise caused by the capacitive coupling and the inductive coupling is within the specification 120. The method provides a quick and simple way of estimating inductive coupling noise.

Figure 6:
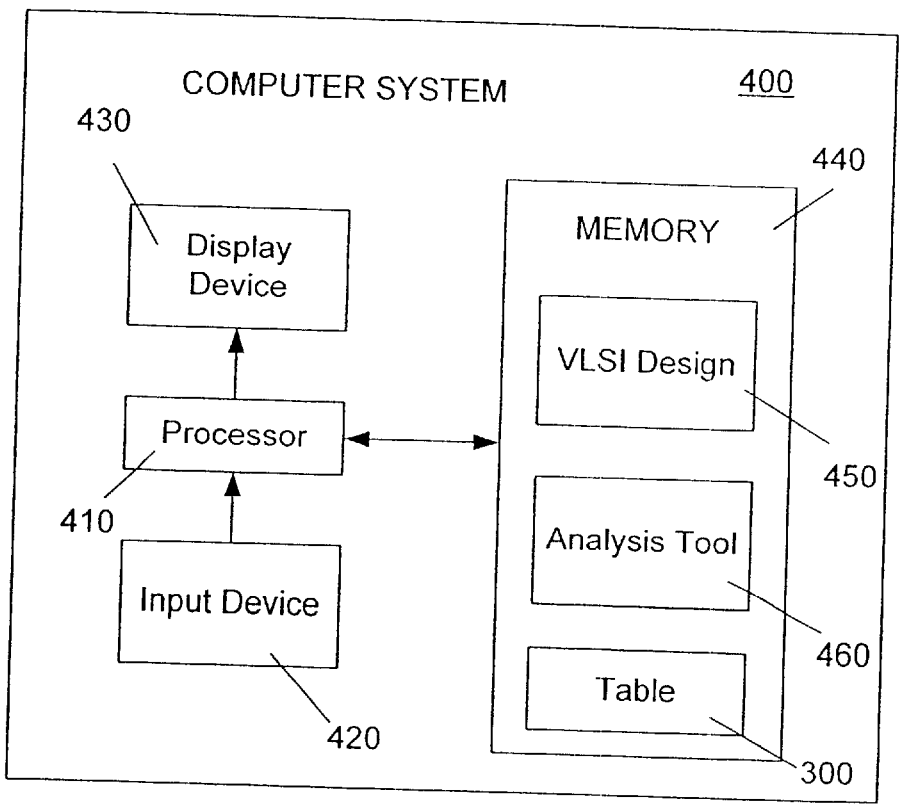
FIG. 6 shows a computer system on which the method may be performed.

FIG. 6 shows a block diagram of a computer system 400 having a processor 410 connected to an input device 420 and a display device 430. The processor 410 accesses memory 440 in the computer system 400 that stores a VLSI circuit design 450. An E-CAD tool 460 is also stored in the memory 440 for analyzing the circuit model 450. In use, the input device 420 receives commands instructing the processor 410 to call the E-CAD tool software 460 to perform a circuit analysis on the model 450. This analysis may include the method for estimating inductive coupling noise described herein. The table 300 created as a result of the method shown in FIG. 3 may be stored in memory 440. The results of the analysis may be displayed on the display device 430.

Although the present invention has been described with respect to particular embodiments thereof, variations are possible. The present invention may be embodied in specific forms without departing from the essential spirit or attributes thereof. In particular, one skilled in the art will recognize that ground lines may be spaced at various intervals, other than the implementation shown. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or read-only memory (ROM). It is desired that the embodiments described herein be considered in all respects illustrative and not restrictive and that reference be made to the appended claims and their equivalents for determining the scope of the invention.

We claim:

1. A method of estimating inductive coupling noise in a transmission line in an integrated circuit design stored in a computer memory, the method comprising:
   specifying an initial condition for a line;
   extracting characteristics of the line;
   determining a total noise value for the line using the characteristics; and
   determining inductive noise for the line using the total noise value.

2. The method of claim 1, further comprising recording the inductive noise.

3. The method of claim 1, wherein the step of specifying an initial condition comprises:
   specifying a length of the line;
   specifying a far-end gate capacitance of the line;
   specifying a size of the line; and
   specifying a distance from the line to another line.

4. The method of claim 3, wherein the step of specifying further comprises specifying a distance from the line to ground.

5. The method of claim 1, wherein the step of specifying comprises specifying a transition rate for a signal on the line.

6. The method of claim 1, wherein the step of extracting characteristics for a line comprises extracting characteristics for a plurality of lines in a layer.

7. The method of claim 1, wherein the step of specifying an initial condition comprises specifying an initial condition for a plurality of lines;
   wherein the step of determining a total noise value for the line using the characteristics comprises determining noise values for the plurality of lines;
   wherein the step of determining inductive noise comprises determining inductive coupling noise for the plurality of lines using the total noise values; and
   further comprising recording the inductive noise for at least one of the plurality of lines.

8. The method of claim 7, wherein the step of recording the inductive noise comprises recording the inductive noise for the line having the most inductive noise.

9. The method of claim 7, wherein the step of specifying an initial condition for a plurality of lines comprises specifying a plurality of initial conditions for the plurality of lines;
   wherein the step of determining a total noise value comprises determining noise values for the plurality of lines for each initial condition;
   wherein the step of determining inductive coupling noise comprises determining inductive coupling noise for the plurality of lines for each initial condition; and
   wherein the step of recording comprises recording in a table for each initial condition.

10. The method of claim 1, wherein the step of extracting characteristics comprises extracting a resistance, a capacitance, and an inductance of the line.

11. The method of claim 1, wherein the step of extracting comprises using a field solver to extract a resistance, a capacitance, and an inductance of the line.

12. The method of claim 1, wherein the step of determining a total noise value comprises performing a circuit simulation to calculate the total noise value using a resistance, a capacitance, and an inductance for the line, and wherein the step of determining inductive noise comprises performing a circuit simulation to calculate an RC noise value caused by the resistance and the capacitance, and calculating the inductive noise as a difference between the total noise value and the RC noise value.

13. The method of claim 1, wherein the step of determining inductive coupling noise comprises determining an inductive coupling noise value that is expressed as a percentage of a supply voltage on the line.

14. A method for estimating the inductive coupling noise on a signal in a circuit design, the method comprising:
   determining capacitive coupling noise on a transmission line in a circuit design, which transmission line carries a signal;
   adding to the capacitive coupling noise a percentage of a supply voltage on a signal to determine a total noise value; and
   comparing the total noise value with an estimated value to determine whether a design meets a specification.

15. The method of claim 14, wherein the step of adding comprises adding the percentage of the supply voltage based on a resistance of the transmission line.

16. The method of claim 14, wherein the step of adding comprises adding a percentage of the supply voltage based on a transition rate of the signal.

17. The method of claim 14, wherein the step of adding comprises adding a percentage of the supply voltage based on a gate capacitance of a load on the transmission line.

18. The method of claim 14, wherein the step of adding a percentage of the supply voltage comprises:

if the transition rate is greater than 100 picoseconds, adding zero percent;

if the transition rate is between 80 and 100 picoseconds, the resistance is less than 100 ohms, and the gate capacitance is less than 20 femptofarads, adding four percent;

if the transition rate is between 80 and 100 picoseconds, the resistance is less than 700 ohms, and the gate capacitance is less than 10 femptofarads, adding four percent;

if the transition rate is between 60 and 80 picoseconds, the resistance is less than 500 ohms, and the gate capacitance is less than 20 femptofarads, adding four percent;

if the transition rate is between 60 and 80 picoseconds, the resistance is less than 1500 ohms, and the gate capacitance is less than 10 femptofarads, adding five percent;

if the transition rate is between 40 and 60 picoseconds, the resistance is less than 700 ohms, and the gate capacitance is less than 20 femptofarads, adding four percent; and if the transition rate is between 40 and 60 picoseconds, the resistance is less than 2000 ohms, and the gate capacitance is less than 10 femptofarads, adding seven percent.

19. The method of claim 14, wherein the step of adding comprises adding a percentage of the supply voltage based on a distance between the transmission line and a ground line.

20. A method of estimating noise caused by inductive coupling of a transmission line that carries a signal in a circuit design, the method comprising:

determining a gate capacitance of a load on a signal carried on a line, driven by a source;

determining a resistance of the line;

determining a transition rate for the signal;

using the gate capacitance, the resistance, and the transition rate to calculate an inductive coupling noise as a percentage of a supply voltage; and storing the inductive coupling noise in a computer memory.

* * * * *